(12) United States Patent
Lin et al.

(10) Patent No.: US 6,396,696 B1
(45) Date of Patent: May 28, 2002

(54) CLIP FOR HEAT SINK

(75) Inventors: Yeu-Lin Lin, Taipei (TW); Aimin Huang, ShenZhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 34 days.

(21) Appl. No.: 09/686,749

(22) Filed: Oct. 10, 2000

(30) Foreign Application Priority Data

Jul. 20, 2000 (TW) ........................................ 089212569

(51) Int. Cl.⁷ ................................................ H05K 7/20
(52) U.S. Cl. ........................ 361/704; 361/707; 257/713; 165/185
(58) Field of Search ................................ 361/702–712, 361/714–723, 760, 783, 807, 816, 683, 687–690, 832; 257/706, 727, 659–662, 691, 778, 625; 174/16.3, 35 R, 260, 51, 35 GC; 165/80.2, 80.3, 80.4, 165, 185; 24/570, 573.1, 533–534, 598.1, 458, 598.2, 625, 459; 248/316.7, 500–510

(56) References Cited

U.S. PATENT DOCUMENTS 6,205,026 B1 * 3/2001 Wong et al. ................ 361/704
6,243,265 B1 * 6/2001 Wong et al. ................ 361/704

\* cited by examiner

*Primary Examiner*—Darren Schuberg
*Assistant Examiner*—Michael Datskovsky
(74) *Attorney, Agent, or Firm*—Wei Te Chung

(57) ABSTRACT

A clip (40) for securing a heat sink (20) to an electronic device (35) includes a body (42) and a fastener (44) slidably attached to the body. The body has a central pressing portion (46), a pair of legs (54, 56) extending downwardly at opposite ends of the body, and a fixing plate (66) depending away from one side edge of the pressing portion. Bent tabs (68, 69) extend from opposite upper and lower edges of the fixing plate, thereby defining a receiving space for receiving the fastener therein. A pressing tab (62) depends from an edge of the pressing portion opposite to the fixing plate. The fastener defines a slot (76) therein, for engaging a projection (18) of a retention module (10). The clip thereby secures the heat sink to the electronic device.

12 Claims, 3 Drawing Sheets

CLIP FOR HEAT SINK

BACKGROUND OF THE INVENTION

1. Field of the Invention

The present invention relates to a clip for a heat sink, and particularly to a clip readily and securely attaching a heat sink to an electronic device.

2. The Related Art

Computer electronic devices such as central processing units (CPUs) frequently generate large amounts of heat, which can destabilize operation and cause damage. A heat sink placed in thermal contact with an electronic device mounted on a socket transfers heat generated from the electronic device through conduction. Oftentimes, a heat sink is secured to an electronic device by a clip.

A conventional clip comprises a central spring portion and two downwardly extending legs with openings respectively defined therein that detachably engage with lugs formed on respective opposite sides of a socket. The spring portion, in a side sectional view, has abowed section in the center that bears against the heat sink and forces it into firm contact with an electronic device mounted on the socket. When the clip is ready for installation, the distance between the legs is less than the distance between the lugs. This ensures that the lower ends of the legs are biased inwardly to assist in retaining each leg opening around its corresponding lug. However, in assembly and disassembly, a large force is required to overcome the spring force of the spring portion. Furthermore, the pressing point of the bowed section of the clip which acts on the heat sink usually does not coincide with the center of the clip, which results in an eccentric moment between the pressing point and the center of the clip. This results in the heat sink and electronic device being prone to disengage when subjected to shock or vibration during normal use.

Examples of conventional clips are disclosed in Taiwan Patent Applications Nos. 85211135, 85214941 and 86213035, and U.S. Pat. Nos. 5,602,719 and 5,600,540.

SUMMARY OF THE INVENTION

Accordingly, an object of the present invention is to provide a clip which readily and securely attaches a heat sink to an electronic device.

To achieve the above-mentioned object, a clip in accordance with the present invention comprises a body and a fastener slidably attached to the body. The body has a central pressing portion, a pair of legs extending downwardly at opposite ends of the body, and a fixing plate depending perpendicularly away from one side edge of the pressing portion. Bent tabs extend from opposite upper and lower edges of the fixing plate, to define a receiving space for receiving the fastener therein. A pressing tab depends perpendicularly from a side edge of the pressing portion opposite to the fixing plate. The fastener defines a slot therein for engaging a projection of a retention module, thereby firmly securing the heat sink to the electronic device.

Other objects, advantages and novel features of the present invention will be drawn from the following detailed embodiment of the present invention with attached drawings, in which:

DESCRIPTION OF THE PREFERRED EMBODIMENT

Figure 1:
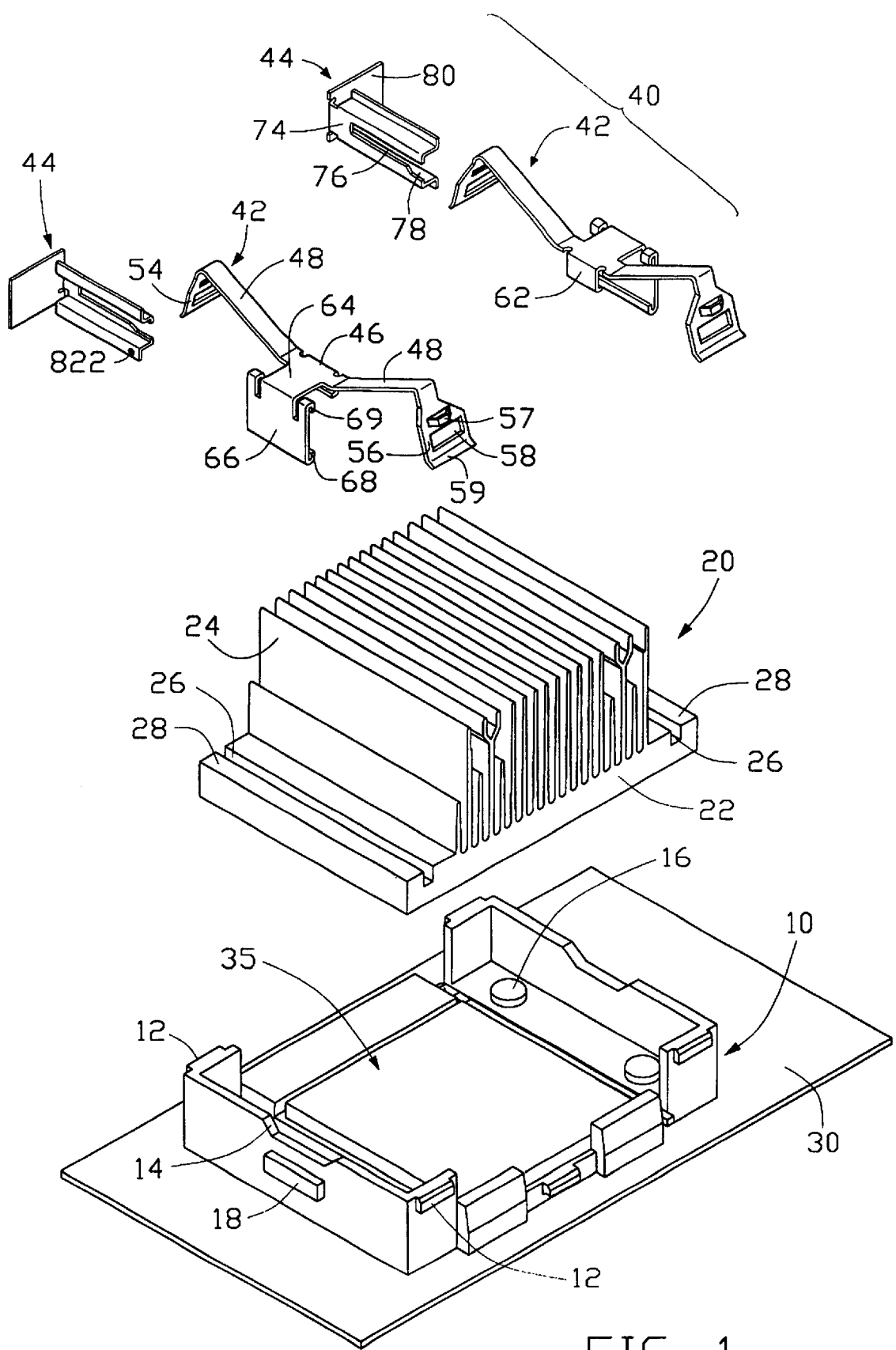
FIG. 1 is an exploded view showing a clip of the present invention attaching a heat sink to an electronic device mounted on a circuit board.

Referring to the attached drawings, FIG. 1 is an exploded view of a heat sink 20, an electronic device 35 mounted on a circuit board 30, a pair of retention modules 10 mounted on opposite sides of the electronic device 35, and a pair of clips 40 constructed in accordance with the present invention. The heat sink 20 comprises a base 22 having a bottom face(not labeled) and an upper face (not labeled) opposite to the bottom face. A pair of shoulders 28 is formed on respective opposite sides of the upper face of the base 22. A pair of grooves 26 is defined in the base 22respectively adjacent and parallel to the shoulders 28. A plurality of fins 24 extends upwardly from the upper face of the base 22 between the grooves 26.

Each retention module 10 is secured on the circuit board 30 by pins 16 or other conventional means. Each retention module 10 defines a cutout 14 in a top edge thereof, and an external horizontal projection 18 below the cutout 14. A pair of catches 12 is formed externally on respective opposite ends of each retention module 10.

Figure 2:
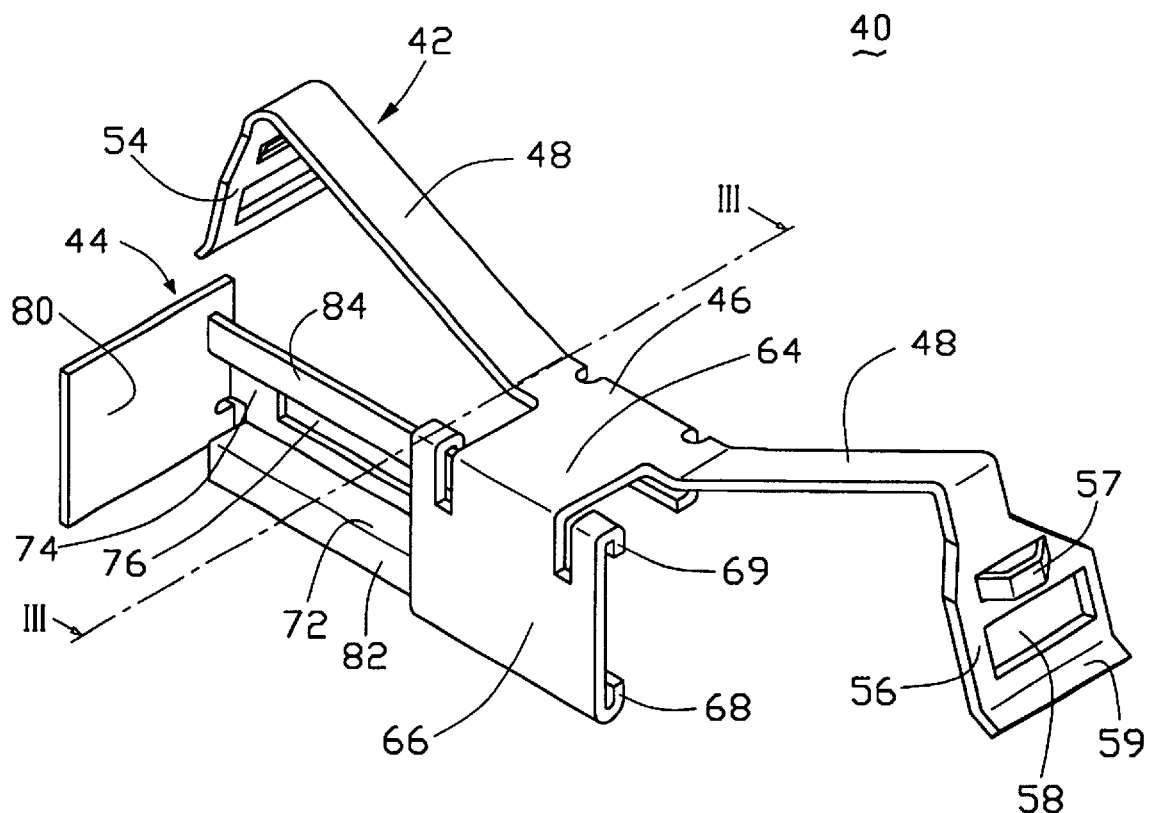
FIG. 2 is a perspective view of the clip showing a fastener at a position of partial engagement with a body of the clip.
Figure 3:
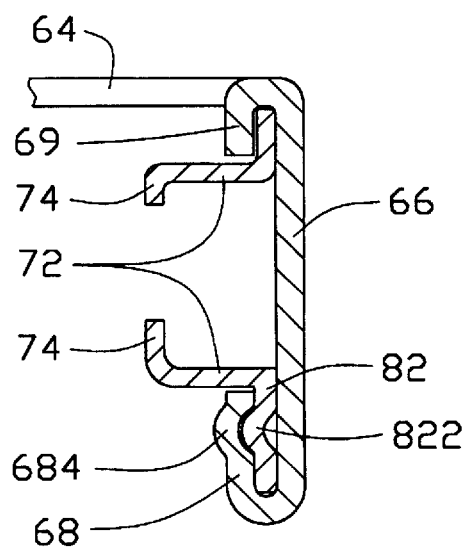
FIG. 3 is a cross-sectional view of the clip taken along line III—III of FIG. 2.
Figure 4:
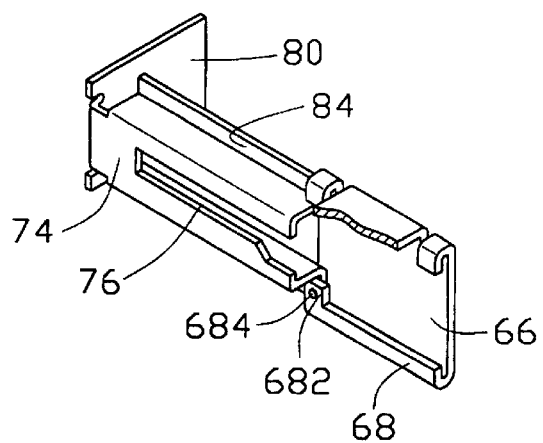
FIG. 4 is similar to FIG. 2 but viewed from another aspect with a portion of the body cut away.

Also referring to the FIGS. 2–4, each clip 40 in accordance with the present invention comprises a body 42 and a fastener 44 slidably attached to the body 42. As shown in FIG. 1, the bodies 42 are similar in structure, and the fasteners 44 are similar in structure. Each body 42 is a mirror image of the other body 42, and each fastener 44 is a mirror image of the other fastener 44.

Each body 42 comprises a central pressing portion 46 corresponding to the shoulder 28 of the heat sink 20, a pair of spring portions 48 extending in respective opposite directions from the pressing portion 46 and a pair of legs 54, 56 extending downwardly from respective spring portions 48. Each leg 54, 56 defines an opening 58 corresponding to and engageable with the catch 12 of the corresponding retention module 10. A protrusion 57 with a hole (not labeled) defined therein is formed on each leg 54, 56 above the opening 58, for being able to receive a tool during assembly. A pressing tab 62 (see FIG. 1) depends vertically from one edge of the pressing portion 46 for being received in the groove 26 of the heat sink 20 and pressing the heat sink 20 against the electronic device 35. A horizontal connector portion 64 extends from the edge of the pressing portion 46 opposite to the pressing tab 62, and corresponds to the cutout 14 of the retention module 10. A fixing plate 66 depends vertically from the outside edge of the connector portion 64. A bent tab 68 extends inwardly and upwardly from a lower edge of the fixing plate 66. A pair of bent tabs 69 extends inwardly and downwardly from an upper edge of the fixing plate 66. The tabs 68, 69 together define a receiving space (not labeled) for receiving the fastener 44. A square tab 682 extends upwardly from one end of the bent tab 68 (see FIG. 4). The square tab 682 defines a concave dimple 684 in an external surface thereof.

Each fastener 44 is L-shaped and comprises a base portion 74, a pair of side walls 72 extending perpendicularly from respective opposite sides of the base portion 74 and a handle portion 80 extending outwardly and perpendicularly to both the base portion 74 and the side walls 72. A slot 76 is defined in the base portion 74, for engaging with the elongate projection 18 of the retention module 10. A cutout 78 is defined in a lower portion of the base portion 74, and is in communication with the slot 76. A pair of flanges 82, 84 extend outwardly and perpendicularly from respective outer edges of the side walls 72. The flanges 82, 84 correspond to the bent tabs 68, 69 respectively. The flange 82 defines a convex nub 822 near an end thereof, for engaging with the concave dimple 684 of the fixing plate 66 (see FIG. 3).

Figure 5:
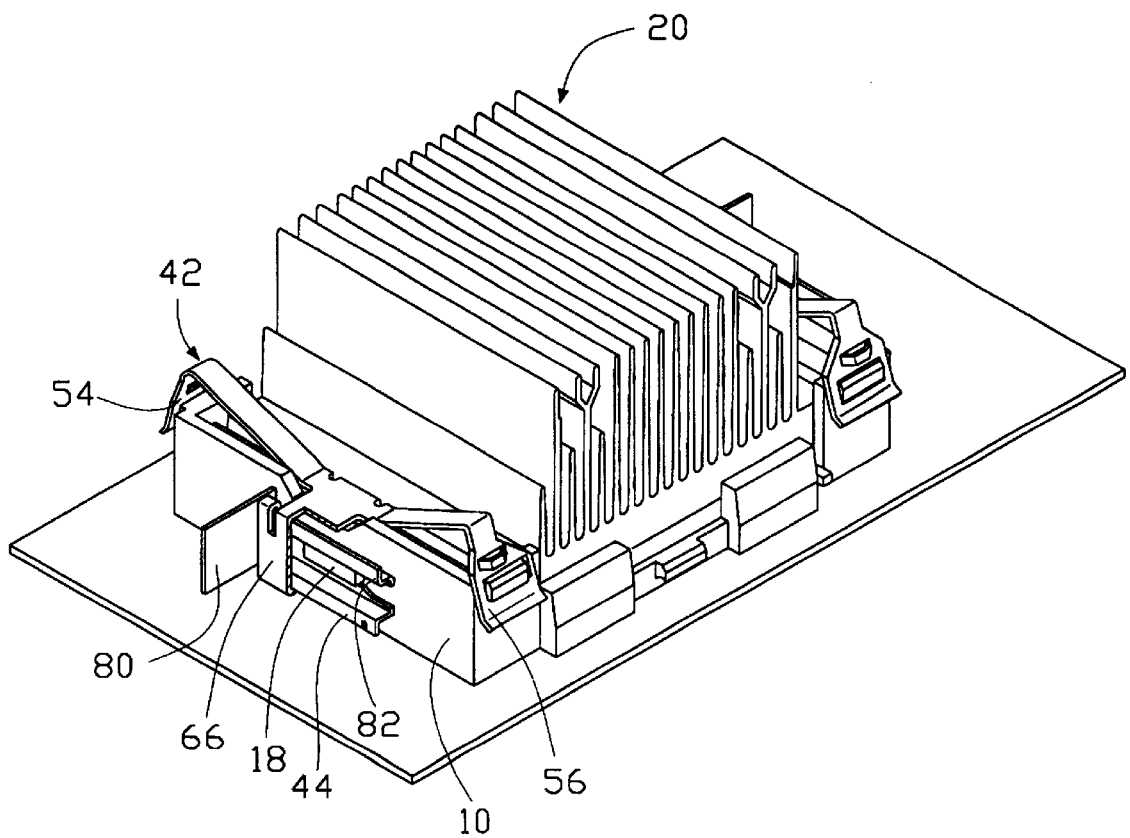
FIG. 5 is an assembled view of FIG. 1.

Also referring to FIG. 5, in assembly, the heat sink 20 is placed on the electronic device 35 between the retention modules 10, with the bottom face of the base 22 abutting the electronic device 35. The body 42 of each clip 40 is placed on the heat sink 20, with the pressing portion 46 abutting the shoulder 28, and the pressing tab 62 being received in the corresponding groove 26. The fastener 44 is then attached in a first position to the body 42. This is done by the nub 822 of the fastener 44 engaging with the concave dimple 684 of the fixing plate 66 (see FIG. 3). The body 42 and fastener 44 combination is then secured to the retention module 10 by pushing the handle portion 80 of the fastener 44 inward. The cutout 78 of the fastener 44 guides the elongate projection 18 of the retention module 10 to be slidably received into the slot 76 of the fastener 44. The fastener 44 is slidably received in the receiving space (not labeled) of the fixing plate 66, with the flanges 82, 84 engaging with the bent tabs 68, 69 respectively. Either leg 54, 56 of the body 42 is then easily secured to the retention module 10, as the opening 58 engages with the catch 12 on one side of the retention module 10. The other leg 56, 54 is then secured to the catch 12 on the other side of the retention module 10 using a tool which extends through the hole (not labeled) of the protrusion 57. Thus the clip 40 is firmly secured to the retention module 10.

The slot 76 of the fastener 44 engaging with the elongate projection 18 of the retention module 10, and the pressing tab 62 of the body 42 engaging with the groove 26 of the heat sink 20 together eliminate the eccentric MOMENT between the pressing point of the clip 40 and the center of the clip 40.

It is understood that the invention may be embodied in other forms without departing from the spirit thereof. Thus, the present example and embodiment is to be considered in all respects as illustrative and not restrictive, and the invention is not to be limited to the details given herein.

What is claimed:

1. A clip adapted to secure a heat sink to an electronic device mounted between a pair of retention modules, comprising:
    a body having a pressing portion adapted to press the heat sink onto the electronic device, a pair of legs extending downwardly at opposite ends of the body and adapted to engage with the retention module, and a fixing plate extending from one side edge of the pressing portion; and
    a fastener slidably attached to the fixing plate and adapted to engage with the retention module.

2. The clip as claimed in claim 1, wherein at least a pressing tab extends from the pressing portion opposite to the fixing plate, to be received in at least a slot defined in the heat sink.

3. The chip as claimed in claim 1, wherein the fastener defines at least a slot, for engaging with at least a projection formed on the retention module.

4. The clip as claimed in claim 1, wherein a plurality of bent tabs extend from opposite upper and lower edges of the fixing plate, thereby defining a receiving space for receiving the fastener therein.

5. The clip as claimed in claim 4, wherein at least one bent tab of the fixing plate defines at least a concave dimple, and the fastener has at least a convex nub for mating with the concave dimple.

6. An electrical device assembly comprising:
    a circuit board;
    an electronic device mounted on the circuit board;
    at least one retention module mounted beside the electronic device;
    a heat sink placed on the electronic device; and
    at least one clip comprising a body and a fastener slidably attached to the body, the body having a pressing portion for pressing the heat sink onto the electronic device, and the fastener engaging with the at least one retention module for securely attaching the heat sink to the electronic device.

7. The electronic device assembly as claimed in claim 6, wherein a fixing plate extends from the pressing portion and defines a receiving space for receiving the fastener therein.

8. The electronic device assembly as claimed in claim 6, wherein the fastener defines at least a slot therein for engaging with at least a projection formed on the retention module.

9. The electronic device assembly as claimed in claim 6, wherein the heat sink defines at least a groove, and at least a pressing tab extends from the pressing portion for engaging with the at least a groove.

10. An electronic device assembly comprising:
    a printed circuit board;
    an electronic device position on the printed circuit board;
    at least one retention module positioned by one side of the electronic device;
    a heat sink positioned on the electronic device;
    a clip including a body and a fastener, said body including a pressing portion abutting against the heat sink, said fastener moved along a longitudinal direction of the body to engage both the body and the retention module for securing the heat sink and the retention module together.

11. The assembly as described in claim 10, wherein said retention module includes a horizontal projection, and the body includes a fixing plate defining a receiving space which is much larger than the projection, and wherein the fastener is dimensioned with portions adapted to snugly engage the projection and the receiving space, respectively.

12. The assembly as described in claim 10, wherein said body further includes a pair of legs and said retention module further includes a pair of catches to latchably engage the corresponding legs, respectively.

* * * * *